(12) United States Patent
DeAngelo

(10) Patent No.: US 10,135,159 B1
(45) Date of Patent: Nov. 20, 2018

(54) BOARD-TO-BOARD CONNECTORS AND MOUNTING STRUCTURE

(71) Applicant: Rosemount Aerospace Inc., Burnsville, MN (US)

(72) Inventor: Tim DeAngelo, Edina, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 15/601,362

(22) Filed: May 22, 2017

(51) Int. Cl.
| | |
|---|---|
| *H01R 12/58* | (2011.01) |
| *H05K 3/46* | (2006.01) |
| *H05K 3/36* | (2006.01) |
| *H01R 43/20* | (2006.01) |
| *H01R 3/00* | (2006.01) |
| *H05K 1/14* | (2006.01) |
| *H05K 3/00* | (2006.01) |

(52) U.S. Cl.
CPC ........... *H01R 12/58* (2013.01); *H01R 43/205* (2013.01); *H05K 1/144* (2013.01); *H05K 3/007* (2013.01); *H05K 3/366* (2013.01); *H05K 3/4644* (2013.01); *H05K 2201/042* (2013.01); *H05K 2201/10318* (2013.01); *H05K 2201/10325* (2013.01)

(58) Field of Classification Search
CPC ...... H01R 12/58; H01R 12/585; H01R 43/28; H01R 43/205; H05K 1/144; H05K 1/141; H05K 1/142; H05K 3/366
See application file for complete search history.

(56) References Cited

U.S. PATENT DOCUMENTS

| | | |
|---|---|---|
| 9,209,540 B2 | 12/2015 | Raff et al. |
| 2015/0194753 A1 | 7/2015 | Raff et al. |
| 2016/0056558 A1 | 2/2016 | Miletich et al. |
| 2016/0105963 A1* | 4/2016 | Isom ................. H01Q 1/50 343/906 |
| 2017/0013712 A1* | 1/2017 | MacDonald ........ C23C 18/1608 |
| 2017/0215286 A1* | 7/2017 | Pirih .................... H05K 1/144 |

* cited by examiner

*Primary Examiner* — Hoa C Nguyen
*Assistant Examiner* — Amol Patel
(74) *Attorney, Agent, or Firm* — Kinney & Lange, P.A.

(57) ABSTRACT

A circuit card assembly includes a first printed wiring board with a first receiving feature and a trace attached to the first printed wiring board. The three dimensional trace is formed by layer-by-layer additive manufacturing. The three dimensional trace includes first and second ends. The first end of the three dimensional trace engages with the first receiving feature of the first printed wiring board. The second end of the three dimensional trace is configured to engage with a second printed wiring board.

20 Claims, 7 Drawing Sheets

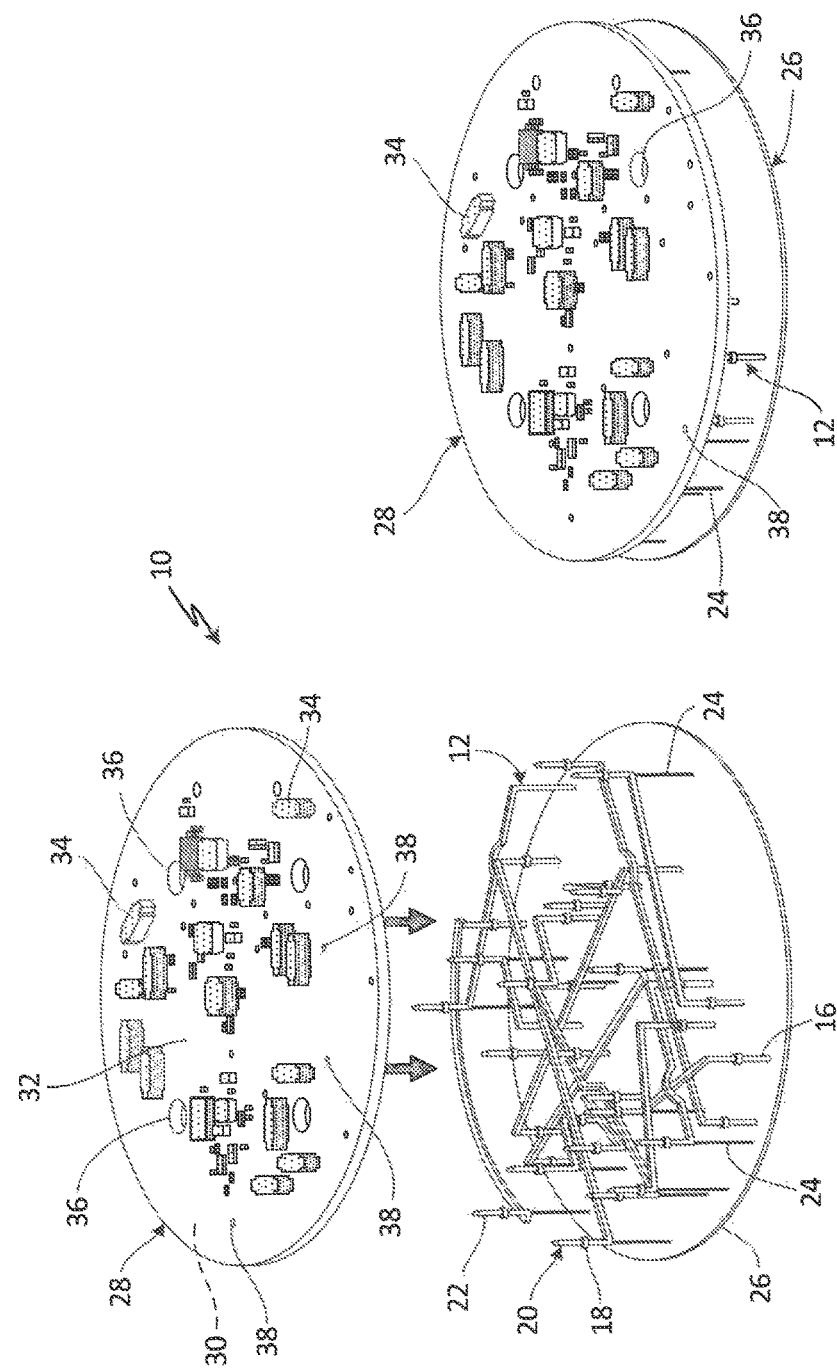

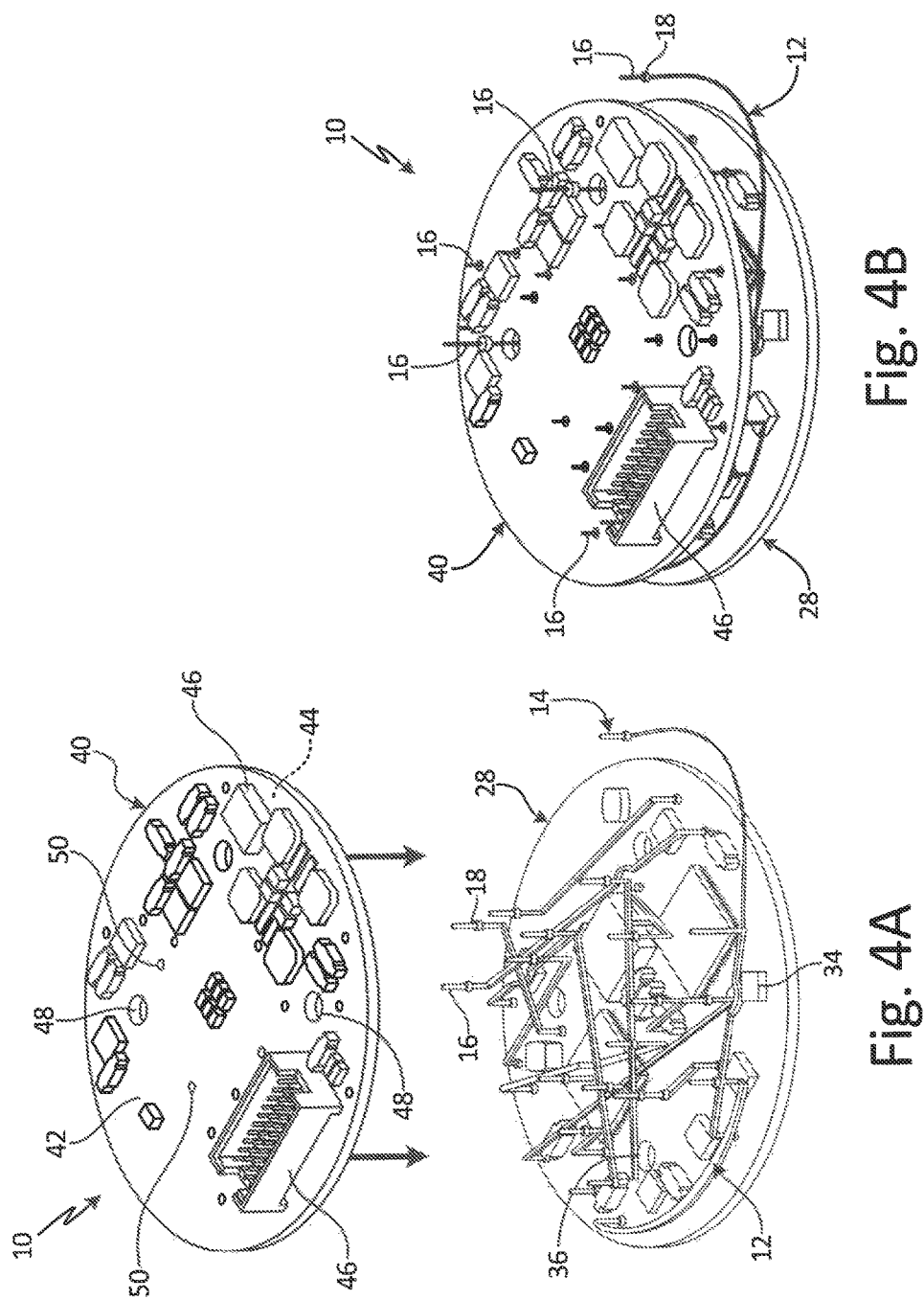

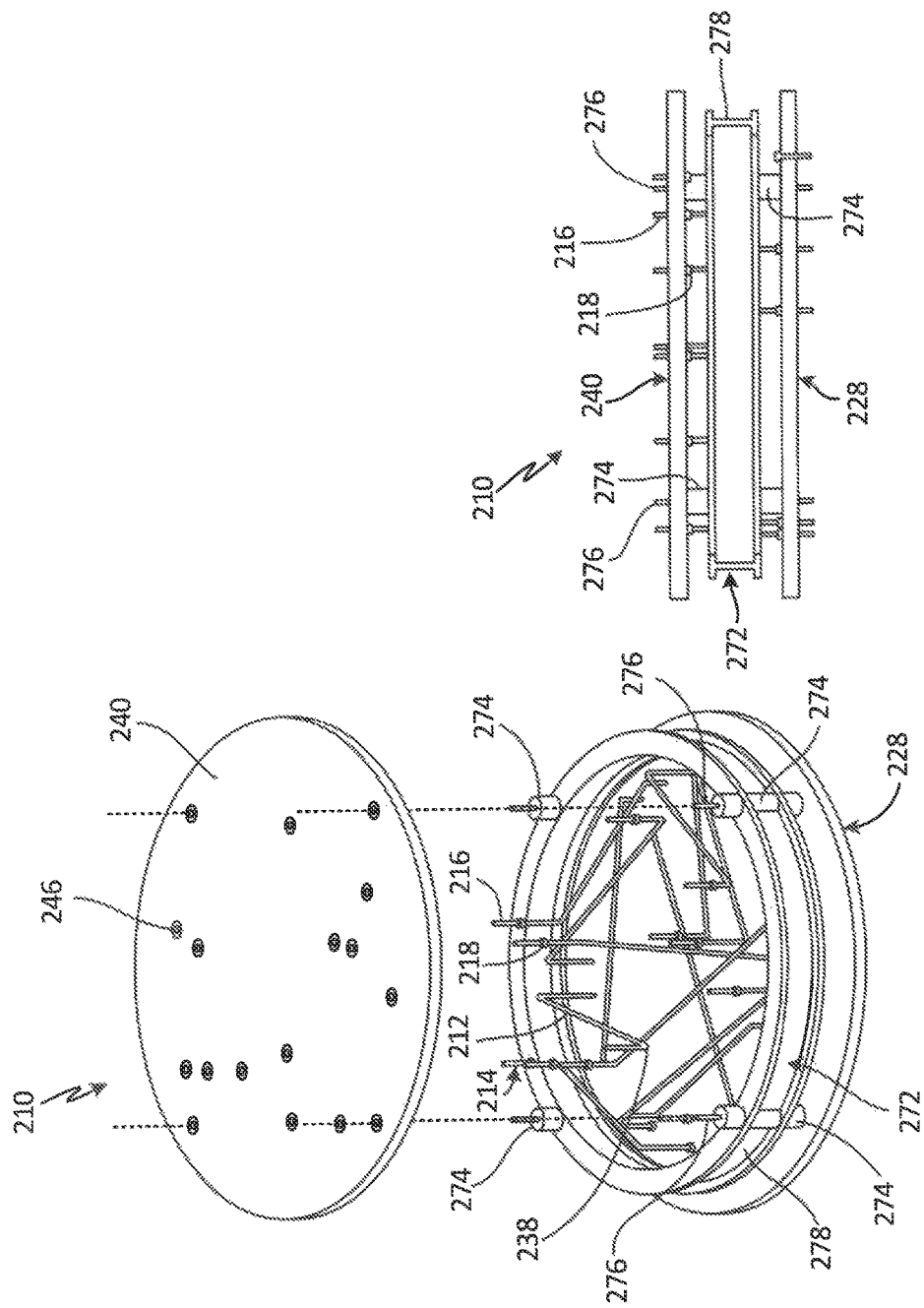

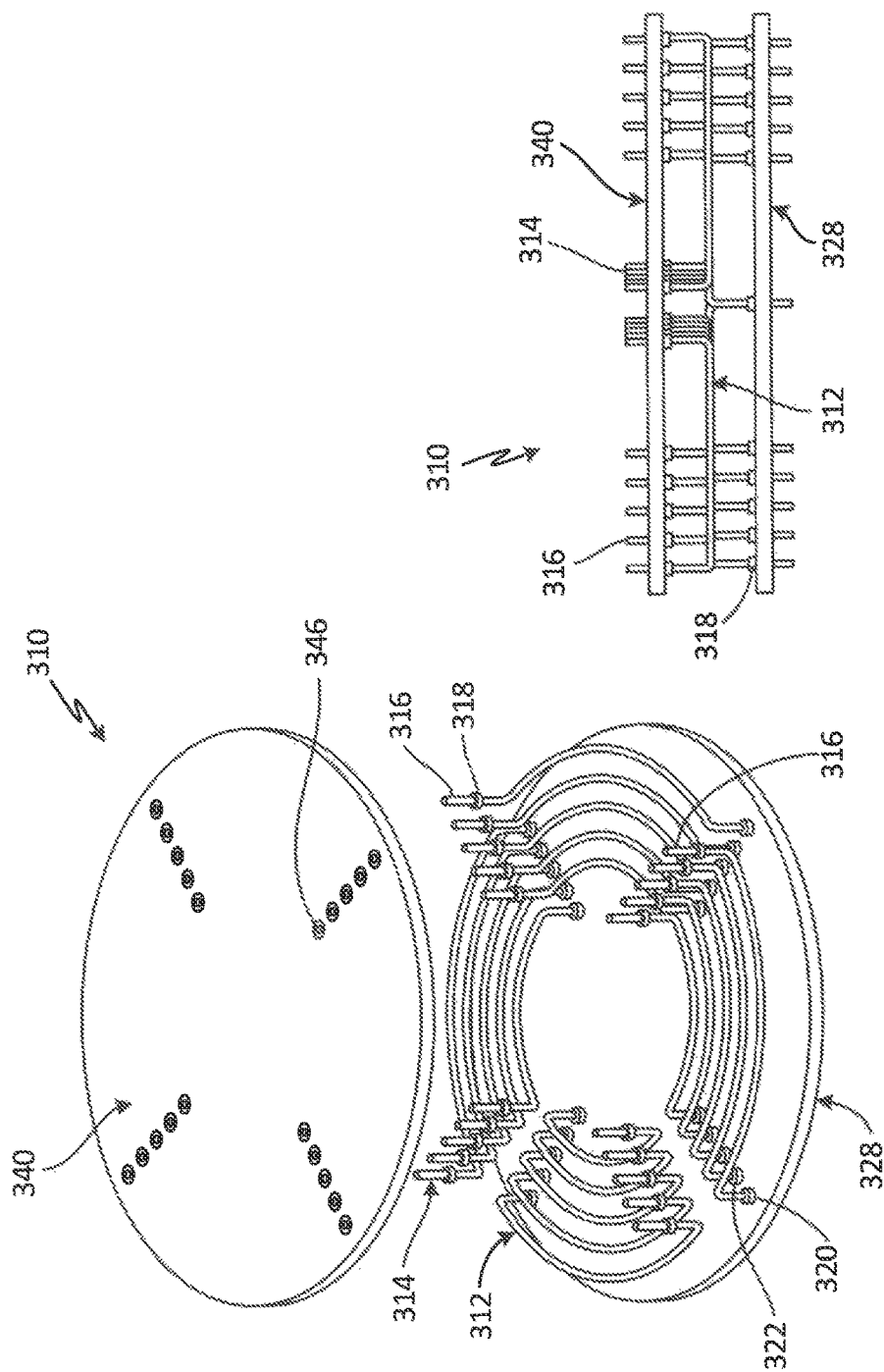

BOARD-TO-BOARD CONNECTORS AND MOUNTING STRUCTURE

BACKGROUND

The present invention relates to electronics. More particularly, the present invention relates to trace connections between printed wiring boards ("PWB's") in circuit card assemblies ("CCA's").

CCA's including multiple PWB's take up a certain amount of physical space necessitated by electrical connectors and mounting features. In applications where minimizing space taken up by the CCA is desirable, such as in guidance, navigation, control and targeting systems for precision guided munitions, the connectors between smaller sized PWB's take up a significant amount of space and the layouts of electronic components and connectors can be complicated for board-to-board interconnectivity.

SUMMARY

A circuit card assembly includes a first printed wiring board with a first receiving feature and a trace attached to the first printed wiring board. The three dimensional trace is formed by layer-by-layer additive manufacturing. The three dimensional trace includes first and second ends. The first end of the three dimensional trace engages with the first receiving feature of the first printed wiring board. The second end of the three dimensional trace is configured to engage with a second printed wiring board.

A method of assembling a circuit card assembly includes forming a first three dimensional trace by layer-by-layer additive manufacturing. The first three dimensional trace includes first end and a second end. The first three dimensional trace is attached to a first printed wiring board with a first receiving feature by inserting the first end of the first three dimensional trace into the first receiving feature. A second printed wiring board is attached to the first three dimensional trace by receiving the second end of the first three dimensional trace in a second receiving feature of the second printed wiring board.

BRIEF DESCRIPTION OF THE DRAWINGS

FIG. 2A is a perspective view of support structures, a fixture, and the three dimensional array of traces separated from a first PWB.

FIG. 2B is a perspective view of the support structures, the fixture, and the three dimensional array of traces brought into contact with the first PWB.

FIG. 4A is a perspective view of the three dimensional array of traces and the first PWB separated from a second PWB.

FIG. 4B is a perspective view of the three dimensional array of traces and the first PWB brought into contact with the second PWB.

FIG. 6A is an exploded perspective view of a CCA including a three dimensional array of traces, a first PWB, and a mounting structure separated from a second PWB.

FIG. 6B is an assembled side view of the CCA of FIG. 6A showing the three dimensional array of traces, first PWB, and the mounting structure brought into contact with the second PWB.

FIG. 7A is an exploded perspective view of a CCA including a first PWB and a three dimensional array of traces separated from a second PWB.

FIG. 7B is an assembled side view of the CCA of FIG. 7A showing the first PWB and the three dimensional array of traces engaged with the second PWB.

DETAILED DESCRIPTION

The proposed circuit card assembly ("CCA") includes utilizing additive manufacturing in order to create thin, complex routing of trace connections to provide board interconnectivity. Utilizing additively manufactured trace connections between printed wiring boards allows proper connectivity without the complicated layouts of alignment pins on and between adjacent boards. The "printed" board-to-board trace connectors can also include mounting structures, shock/vibration mitigation features, and provide easy access to specific test points for debugging the CCA. Additional features such as removable assembly aids (frames/structures removed after assembly), locating features, solder aids such as fillet relief in stops, built in solder cups, extended leads for test points, heat sinking elements, and electromagnetic interference shielding can also be incorporated.

Figure 1:
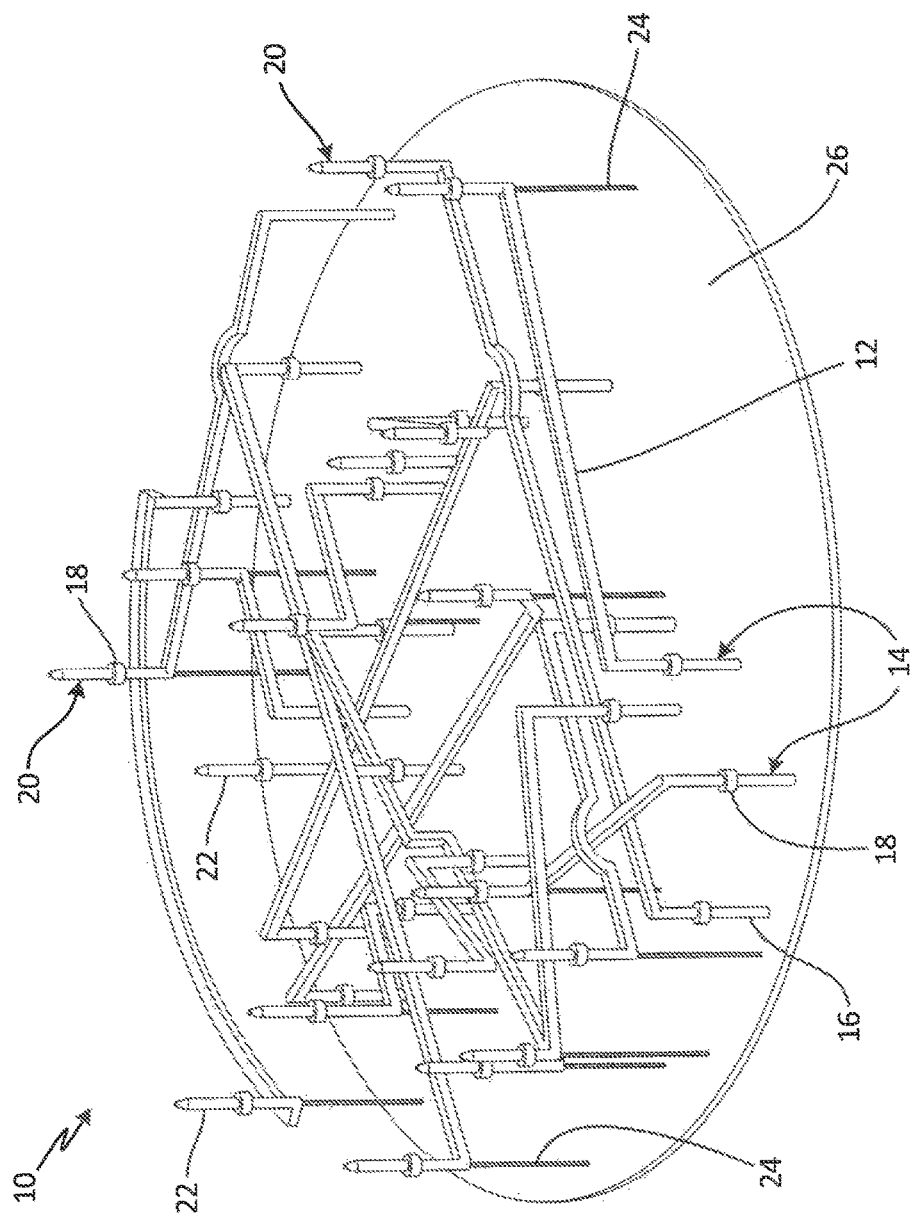
FIG. 1 is a perspective view of a three dimensional array of traces.

FIG. 1 shows a perspective view of CCA 10 (FIGS. 1-4B) including traces 12 (with first ends 14, first engagement feature 16, stops 18, second ends 20, second engagement features 22), support structures 24, and fixture 26.

CCA 10 is an assembly of electrical components. In one non-limiting embodiment, CCA 10 can be used in a guidance, navigation, control, and targeting system for a precision guided munition. Traces 12 are a three-dimensional array of interconnections for transporting an electrical signal. In one non-limiting embodiment, a material of traces 12 can include copper or another type of metal with desirable conductive, electrical, and thermodynamic characteristics. In another non-limiting embodiment, at least one of traces 12 can include a non-conductive material. Traces 12 are formed by layer-by-layer additive manufacturing. In one non-limiting embodiment, traces 12 can include a circular cross-sectional shape, but can also include another cross-sectional shape such as elliptical, square, triangular, or other geometric shape.

First ends 14 and second ends 20 are terminal ends of each of trace 12. First engagement features 16 and second engagement features 22 are mounting features. In one non-limiting embodiment, either of first engagement features 16 and second engagement features 22 can include a pin or a socket. Stops 18 are pieces of solid material with a slightly larger radius than each of traces 12. In one non-limiting embodiment, stops 18 can include a cylindrical shape.

Support structures 24 are thin pieces of solid material. In one non-limiting embodiment, support structures 24 can include thin cylindrical structures. In other non-limiting embodiments, support structures 24 can be formed with the same additive manufacturing process and/or material used to create traces 12. In one non-limiting embodiment, fixture 26 can be a flat disk of solid material. In other non-limiting embodiment, fixture 26 can include a shape other than a flat disk such as a design which minimizes the amount of material used or designed to assist assembly of the interconnect process for CCA 10 and/or the removal of support structures 24. In one non-limiting embodiment, fixture 26 can be formed with the same additive manufacturing process and/or material used to create traces 12 and support structures 24.

Each of traces 12 are formed by layer-by-layer additive manufacturing and are configured to extend away from fixture 26 and occupy a three dimensional space. Traces 12 are attached to support structures 24 and to fixture 26. Each of traces 12 occupy its own individual space. Traces 12 are additively manufactured (e.g., 3D-printed) to include various pathways, heights, shapes, volumes, and positions in physical space in order to pass, jut, jog around, and/or avoid coming into contact with other traces 12. In some non-limiting embodiments, traces 12 are designed and manufactured such that adequate spacing between adjacent traces 12 is maintained so as to prevent electro-dynamic and/or thermodynamic interference as well as arcing between traces 12 (e.g., high altitude arcing). In other non-limiting embodiments, the spacing between traces 12 can be configured to allow for potting material to be inserted in the spaces between traces 12 and between PWB's on either sides of traces 12. Potting material can be used to electrically insulate all of the elements of CCA 10, such as to prevent high-altitude arcing between elements of CCA 10.

First ends 14 and second ends 20 are disposed on opposite ends of each trace 12 from each other. First ends 14 are generally disposed along a first plane extending along a first major side of traces 12. Second ends 20 are generally disposed along a second plane extending along a second major side of traces 12. First engagement features 16 are connected to and extend outward from first ends 14 of traces 12. Stops 18 are disposed on first ends 14 and second ends 20 of traces 12. Stops 18 are integrally formed with and a part of first ends 14 and second ends 20 of traces 12. Second engagement features 22 are connected to and extend outward from second ends 16 of traces 12.

Support structures 24 are connected to traces 12. In some non-limiting embodiments, support structures 24 are removably attached to and formed with traces 12. In other non-limiting embodiments, support structures 24 can be attached to other locations on traces 12 other than those locations shown in FIGS. 2A and 2B. Fixture 26 is connected to first ends 14 and to support structures 24. Traces 12, support structures 24, and fixture 26 are formed during the layer-by-layer additive manufacturing process such that traces 12, support structures 24, and fixture 26 are integrally formed as a single piece and of the same material.

Traces 12 are fabricated or formed with support structures 24 and fixture 26 so as to hold traces 12 in place for proper alignment with engagement features of a PWB during assembly of a CCA. Support structures 24 provide support for traces 12 during additive manufacturing of traces 12. When connected to a PWB (see e.g., FIGS. 2B-7B), traces 12 transmit electrical signals through traces 12 from one electrical component to another.

Traces 12 allow layouts of electrical components on adjacent PWB's to be independent of each other such that the traces can run from any location on a first PWB to any location on a second PWB. This aspect eliminates the need to route traces to specific locations for mating connectors fixed to a surface of one of the PWB's. Traces 12, or board-to-board connectors, can be put anywhere convenient to the layout of the PWB and not restricted by commercial off the shelf board-to-board connectors which typically include a specific, set arrangement of electrical components.

Utilizing metal additive manufacturing technologies to produce traces 12, thin complex routing of board-to-board connections can be manufactured to provide interconnectivity without the existing, complicated layouts of aligning a large quantity of pins disposed on the surfaces of adjacent PWB's in CCAs. Traces 12 can be used as extensions to the circuit traces between PWB's that can weave around electronic parts and components, connect in multiple locations, and be placed in convenient locations on each of adjacent PWB's. Traces 12 can also include a mounting structure, shock or vibration mitigation features, and provide easy access to specific test points for debugging the PWB's and/or CCA.

FIG. 2A shows a perspective view of CCA 10 with traces 12, support structures 24, and fixture 26 separated from first PWB 28 (with first side 30, second side 32, electrical components 34, thru-holes 36, and receiving features 38). FIG. 2B shows a perspective view of CCA 10 with traces 12, support structures 24, and fixture 26 in contact with first PWB 28. FIGS. 2A and 2B will be discussed in unison.

First PWB 28 is a printed wiring board. First side 30 and second side 32 are opposite planar sides of first PWB 28. Electrical components 34 are electronic devices attached and electrically connected to first PWB 28. In one non-limiting embodiment, electrical components can include any one or more of active, passive, or electro-mechanical components known in the art. Thru-holes 36 are passages or spacial voids extending through first PWB 28 from first side 30 to second side 32. Receiving features 38 are receptacles configured to receive second engagement features 22 of traces 12. In some non-limiting embodiments, receiving features 38 can include a port, a connector, a socket, or other type of electrical connector.

During the design and manufacturing processes of traces 12, first and second ends 14 and 16 of traces 12 are located so as to correspond to the positioning of receiving features 38 on first PWB 28. As first PWB 28 is brought into contact with traces 12, second ends 16 of traces 16 engage with first PWB 28 by inserting into receiving features 38 of first PWB 28. As first PWB 28 is lowered onto traces 12, first side 30 of first PWB 28 comes into contact with one or more of stops 18 so as to prevent, or "stop," first PWB 28 from moving any further towards fixture 26. In some non-limiting embodiments, traces 12 can be attached to first PWB 28 between second ends 20 and receiving features 38 via mechanical or chemical attachment such as welding, soldering, brazing, or another joining process. In other non-limiting embodiments, traces 12 can also be mounted to first PWB 28 using surface mount technology ("SMT") type connections.

Figure 3B:
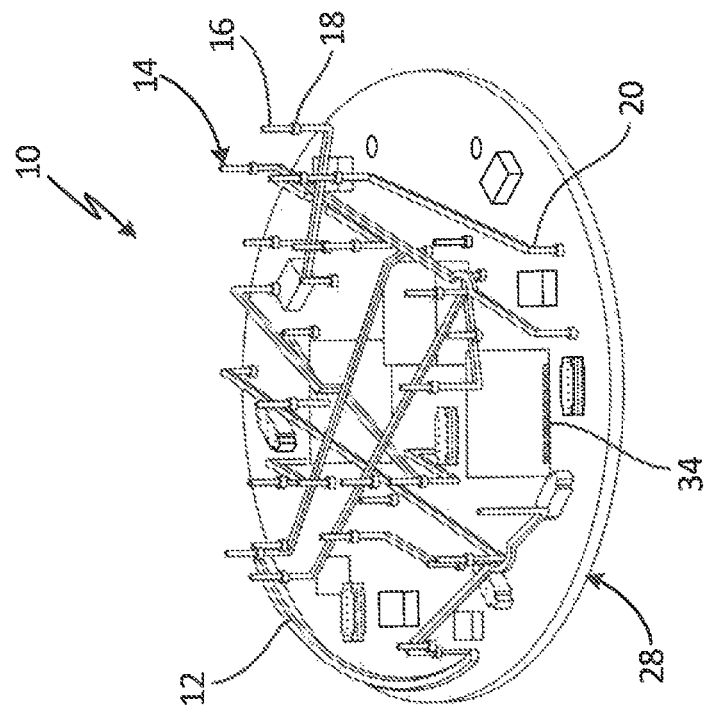
FIG. 3B is a perspective view of the support structures removed from the three dimensional array of traces.
Figure 3A:
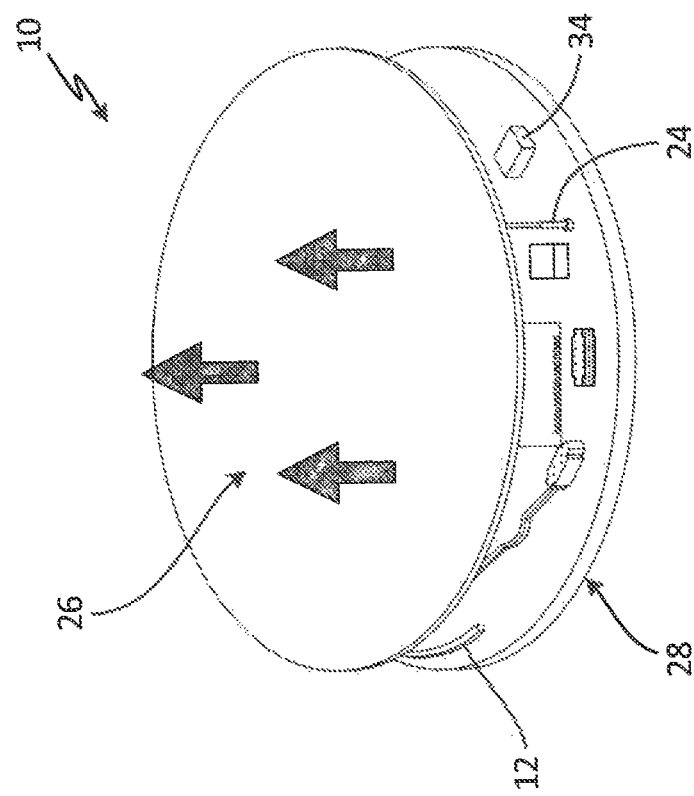
FIG. 3A is a perspective view of the fixture attached to the support structures of the three dimensional array of traces.

FIG. 3A shows a perspective view of CCA 10 with fixture 26 attached to support structures 24 of traces 12. FIG. 3B is a perspective view of CCA 10 with support structures 24 removed from traces 12. FIGS. 3A and 3B will be discussed in unison. FIG. 3A is inverted from FIG. 2B such that fixtures 26 is now on top of CCA 10 and first PWB 28 is on the bottom of CCA 10.

After first PWB 28 is attached to traces 12 (as discussed in FIGS. 2A and 2B), support structures 24 with fixture 26 are removed from traces 12 to expose first ends 14. In one non-limiting embodiment, support structures 24 with fixture 26 can be removed from traces 12 by clipping each of support structures 24 with a cutting or clipping device. In other non-limiting embodiments, an amount of force can be applied to at least one of support structures 24 and/or fixture 26 in the form of friction, torsion, shear, tensile, compression, vibration, thermodynamic, or other types of forces in order to remove support structures 24 and fixture 26. With support structures 24 and fixture 26 removed from traces 12, first ends 14 are exposed enabling first ends 14 of traces 12 to engage with a second PWB (see e.g., FIGS. 4A and 4B).

FIG. 4A shows a perspective view of CCA 10 with traces 12 and first PWB 28 separated from second PWB 40 (including first side 42, second side 44, electrical components 46, thru-holes 48, and receiving features 50). FIG. 4B shows a perspective view of CCA 10 with second PWB 40 brought into contact with traces 12 on first PWB 28. FIGS. 4A and 4B will be discussed in unison.

Due to the design and manufacturing of traces 12 with layer-by-layer additive manufacturing, first ends 14 of traces 12 are configured to line-up with correspondingly located receiving features 50 in second PWB 40. As second PWB 40 is moved towards and brought into contact with traces 12, first engagement features 16 on first ends 14 of traces 12 insert into and engage with receiving features 50 of second PWB 40. Stops 18 prevent second PWB 40 from moving too close to first PWB 28 and maintain an adequate amount of spacing between first PWB 28 and second PWB 40 for traces 12 and electrical components 34.

After first ends 14 of traces 12 are received by receiving features 50 of second PWB 40, first ends 14 are soldered so as to secure them to second PWB 40. In some non-limiting embodiments, traces 12 can be attached to second PWB 40 via mechanical or chemical attachment such as welding, soldering, brazing, or another joining process. In other non-limiting embodiments, traces 12 can also be mounted to second PWB 40 using SMT type connections. Excess material is then cut or trimmed from first ends 14. In other non-limiting embodiments, first ends 14 can be left untrimmed so as to extend beyond second PWB 40 so as to engage with another component such as a third PWB.

Once first PWB 28 and second PWB 40 are connected via traces 12, one or both or first PWB 28 and second PWB 40 can be turned on or energized to operate electronically. Traces 12 create electrical connections between first PWB 28 and second PWB 40. In this way, traces 12 prevent the need to run complex and complicated electrical traces within the layers and/or along the surfaces of first PWB 28 and second PWB 40 which simplifies the layouts of first PWB 28 and second PWB 40. CCA 10 with traces 12 also reduces the amount of space required by first PWB 28 and second PWB 40 due to the decreased amount of surface traces needing to run along the surfaces of first PWB 28 and second PWB 40. This space minimization of first PWB 28 and second PWB 40 reduces the overall size of CCA 10 allowing CCA 10 to be used in applications where size is at a premium such as in guidance, navigation, control and targeting systems for precision guided munitions.

In FIGS. 4A and 4B, traces 12 are shown to be contained within outer circumferences of first PWB 28 and second PWB 40. In other non-limiting embodiments, traces 12 can pass along an outside of the circumferences of first PWB 28 and second PWB 40 so as to allow traces 12 to connect to different sides of first PWB 28 and/or second PWB 40, as well as to connect to elements other than first PWB 28 or second PWB 40 such as a third PWB or other electrical or structural component. In other non-limiting embodiments, traces 12 can extend through thru-holes 36 or thru-holes 48 of first PWB 28 or second PWB 40, respectively so as to pass through and connect to another electrical element such as a third PWB.

The process of attaching multiple PWB's together with additively manufactured traces 12 can repeat to produce CCA 10 with as many PWB's as needed for a given application. In other non-limiting embodiments, CCA 10 with traces 12 can be incorporated with other PWB's that do not include the use of three-dimensional trace arrays.

Figure 5B:
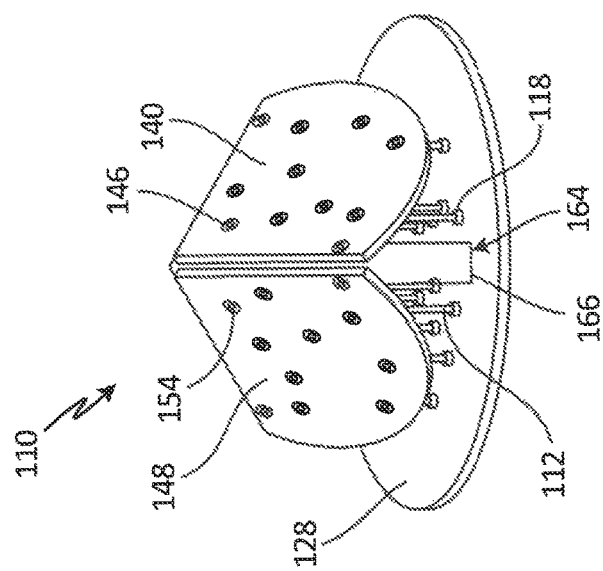
FIG. 5B is a perspective view of the three dimensional array of traces, four PWB's, and the frame assembled together.
Figure 5A:
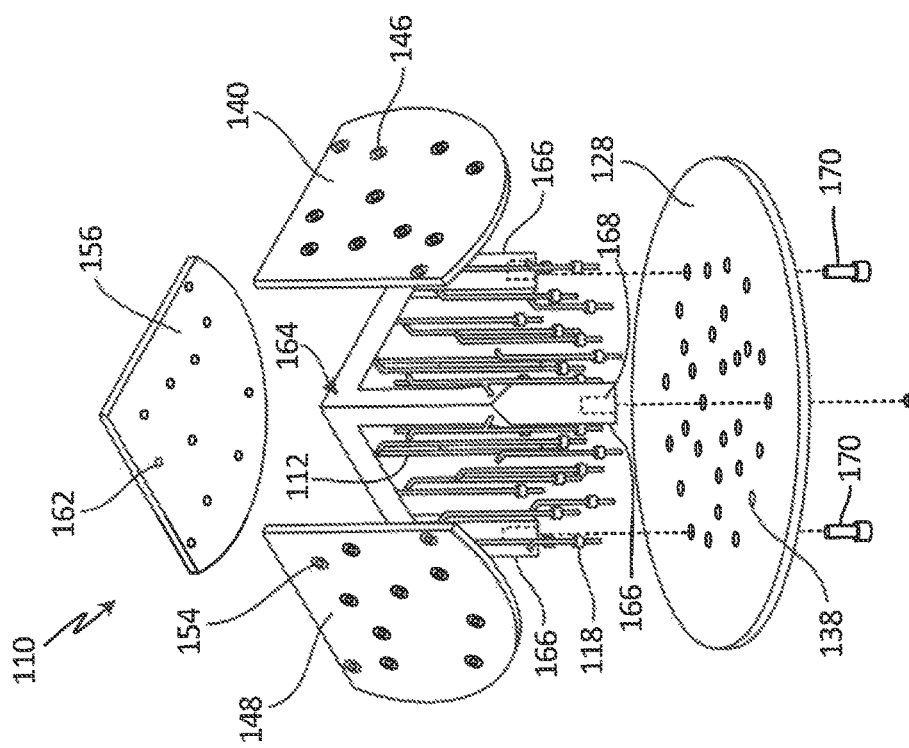
FIG. 5A is an exploded view of a three dimensional array of traces, four PWB's, and a frame.

FIG. 5A is an exploded view of CCA 110 (FIGS. 5A-5B) including traces 112 (with ends 114, engagement features 116, and stops 118), first PWB 128 (with receiving features 138), second PWB 140 (with receiving features 146), third PWB 148 (with receiving features 154), fourth PWB 156 (with receiving features 162), frame 164 (with legs 166 and sockets 168), and fasteners 170. FIG. 5B is a perspective view of traces 112, first PWB 128, second PWB 140, third PWB 148, fourth PWB 156, frame 164, and fasteners 170 assembled together.

Traces 112 are a three-dimensional array of interconnections for transporting an electrical signal. In one non-limiting embodiment, CCA 110 and traces 112 can be formed or assembled by the layer-by-layer additive manufacturing process and assembly method described above with respect to any one of FIGS. 1-4B. First PWB 128, second PWB 140, third PWB 148, and fourth PWB 156 are printed wiring boards. Frame 164 is a structural support of solid material. In one non-limiting embodiment, a material of frame 164 can include a rigid or solid material. In another non-limiting embodiment, the material of frame 164 can include a non-conductive material such as an insulator of glass, porcelain, rubber, plastic, or other low conductivity (and/or high resistivity) material. In other non-limiting embodiments, frame 164 can include a material with elastic or resilient properties that allow frame 164 to absorb and dampen relative motion, vibrations, thermodynamics, or other operating conditions between any of traces 112, first PWB 128, second PWB 140, third PWB 148, and/or fourth PWB 156. In another non-limiting embodiment, frame 164 can be printed at the same time as traces 112 and can be used as a support structure and for alignment of engagement features 116 with receiving features 138, 146, 154, and 162. Legs 166 are extensions of frame 164. Sockets 168 are holes in ends of legs 166 of frame 164. Fasteners 170 are threaded fasteners such as screws or bolts.

Traces 112 are aligned with first PWB 128, second PWB 140, third PWB 148, and fourth PWB 156 such that ends 114 of traces 112 correspond with receiving features 138, 146, 154, and 162 of first PWB 128, second PWB 140, third PWB 148, and fourth PWB 156, respectively. Sockets 168 of legs 166 align with some of receiving features 138 in first PWB 128. Fasteners 170 align with sockets 168 of legs 166 through these receiving features 138 in first PWB 128.

To assemble CCA 110, traces 112 are brought into contact and engage with first PWB 128. Ends 114 of traces 112 are received by and inserted into receiving features 138 of first PWB 128. In one non-limiting embodiment, traces 112 can be soldered to first PWB 128. Frame 164 is brought into contact with first PWB 128 and sockets 168 and legs 166 are aligned with receiving features 138. Fasteners 170 are inserted into receiving features 138, through first PWB 128, and inserted into sockets 168 of legs 166 of frame 164. Fasteners 170 are threadably engaged with sockets 168 so as to attach frame 164 to first PWB 128. In another non-limiting embodiment, fasteners 170 can also be soldered, press fit, glued, or otherwise attached or affixed to PWB 128.

Second PWB 140, third PWB 148, and fourth PWB 156 are then brought into contact with traces 112 and frame 164. Traces 112 insert into and engage with receiving features 146, 154, and 162 of second PWB 140, third PWB 148, and fourth PWB 156, respectively. In one non-limiting embodiment, traces 112 can be soldered to any one of second PWB 140, third PWB 148, and/or fourth PWB 156. In other non-limiting embodiments, ends 114 of traces 112 can be cut or clipped from extending beyond any one of first PWB 128, second PWB 140, third PWB 148, and/or fourth PWB 156. In other non-limiting embodiments, any one of first PWB 128, second PWB 140, third PWB 148, and/or fourth PWB 156 can include thru-holes through which traces 112 can extend through for engagement with other electrical elements. In other non-limiting embodiments, traces 112 can extend outwards from CCA 110 for engagement with other electrical elements.

Frame 164 functions to support each of first PWB 128, second PWB 140, third PWB 148, and/or fourth PWB 156 relative to each other. Frame 164 acts to prevent relative motion between first PWB 128, second PWB 140, third PWB 148, and/or fourth PWB 156. Frame 164 also functions to provide an attachment guide, assembly template, and/or mistake-proofing mount for each of first PWB 128, second PWB 140, third PWB 148, and fourth PWB 156 during assembly of CCA 110. In other non-limiting embodiments, CCA 110 can include more or less than four PWB's, as well as PWB's configured both in co-planar (e.g., parallel) and non-planar (e.g., non-parallel) configurations and arrangements. In one non-limiting embodiment, the material and/or configuration of frame 164 can be tuned to match a specific frequency level of an object that CCA 110 is installed in, such as in an airborne munition.

FIG. 6A shows an exploded perspective view of CCA 210 (FIGS. 6A-6B) including traces 212 (with ends 214, engagement features 216, and stops 218), first PWB 228 (with receiving features 238) and mounting structure 272 (with posts 274, engagement features 276, and band 278) separated from second PWB 240 (with receiving features 246). FIG. 6B is an assembled side view of CCA 210 showing first PWB 228 and mounting structure 272 brought into contact with second PWB 240. FIGS. 6A and 6B will be discussed in unison.

Mounting structure 272 includes a ring of solid material. In one non-limiting embodiment, a material of mounting structure 272 can include a non-conductive material. Posts 274 include cylindrical posts of solid material. Engagement features 276 are mounting features. In one non-limiting embodiment, engagement features 276 can include a pin or a socket. Band 278 is a flat, thin strip of solid material. In this non-limiting embodiment, band 278 can extend completely around a circumference of first and second PWB's 228 and 240. In other non-limiting embodiments, mounting structure 278 can include various discrete or continuous elements extending between portions of first and second PWB's 228 and 240.

Mounting structure 272 is disposed between first and second PWB's 228 and 240. Posts 274 are attached to band 278 periodically around a circumference of mounting structure 272. Engagement features 276 extend outward from posts 274. Engagement features 276 insert into, and engage with receiving features 238 of first PWB 228 and with receiving features 246 of second PWB 240. Band 278 extends in a circular shape and extends between posts 274. In the non-limiting embodiment shown in FIG. 6B, band 278 can include an "I" shaped cross-section. In other non-limiting embodiment, band 278 can include a shape, thickness, height, width, and/or material configured to provide a desirable stiffness, spring coefficient, or thermodynamic characteristics as desired.

Band 278 of mounting structure 272 functions to support each of traces 212, first PWB 228, and second PWB 140 relative to each other from oscillations, vibrations, shock, torsion, or other forces. Mounting structure 272 with engagement features 276 also provides an attachment guide, assembly template, and/or mistake-proofing mount for each of traces 212, first PWB 228, and/or second PWB 240.

FIG. 7A is an exploded perspective view of CCA 310 (FIGS. 3A-3B) including traces 312 (with first ends 314, first engagement features 316, stops 318, second ends 320, and second engagement features 322) and first PWB 328 (with receiving features 338) separated from second PWB 340 (with receiving features 346). FIG. 7B shows an assembled side view of CCA 310 showing traces 312 and first PWB 328 engaged with second PWB 340. FIGS. 7A and 7B will be discussed in unison.

In addition to being a three-dimensional array of interconnections for transporting an electrical signal, traces 312 are resilient elements (e.g., springs). Traces 312 extend angularly around portions of first PWB 328 and second PWB 340. Due to traces 312 extending angularly around portions of first PWB 328 and second PWB 340, traces 312 include a spring-like function due to a lever arm (e.g., torque moment arm) created as a result of the length of each trace 312. In other non-limiting embodiments, a quantity, length, size, or other characteristics of traces 312 can be varied so as to tune a spring constant of traces 312 either generally or for individual traces in order to adjust to specific vibration, shock, and/or load requirements. In one non-limiting embodiment, traces 312 can include an arc shape. In other non-limiting embodiments, traces 312 can include other curved or serpentine shapes, as well as other geometric shapes or line-paths.

Discussion of Possible Embodiments

The following are non-exclusive descriptions of possible embodiments of the present invention.

A circuit card assembly includes a first printed wiring board with a first receiving feature and a trace attached to the first printed wiring board. The three dimensional trace is formed by layer-by-layer additive manufacturing. The three dimensional trace includes first and second ends. The first end of the three dimensional trace engages with the first receiving feature of the first printed wiring board. The second end of the three dimensional trace is configured to engage with a second printed wiring board.

The assembly of the preceding paragraph can optionally include, additionally and/or alternatively, any one or more of the following features, configurations and/or additional components.

The circuit card assembly can comprise a plurality of traces in a three dimensional array.

The first receiving feature of the first printed wiring board can comprise a solder cup, a socket, a surface mount, or a thru-hole.

The second end of the three dimensional trace can comprise a pin or a socket.

The circuit card assembly can further comprise a structural support, a stop, a chamfer, a heat sink, a test point lead, an electromagnetic shield, a locating feature, and/or a resilient element with a spring constant.

The structural support, stop, chamfer, heat sink, solder cup, test point lead, electromagnetic shield, locating feature, or resilient element can be integrally formed with the trace.

The three dimensional trace can comprise a non-conductive material.

The second printed wiring board can comprise a second receiving feature.

The second printed wiring board can be disposed non-parallel to the first printed wiring board.

A method of assembling a circuit card assembly includes forming a first three dimensional trace by layer-by-layer additive manufacturing. The first three dimensional trace includes first end and a second end. The first three dimensional trace is attached to a first printed wiring board with a first receiving feature by inserting the first end of the first three dimensional trace into the first receiving feature. A second printed wiring board is attached to the first three dimensional trace by receiving the second end of the first three dimensional trace in a second receiving feature of the second printed wiring board.

The method of the preceding paragraph can optionally include, additionally and/or alternatively, any one or more of the following features, configurations and/or additional components.

A plurality of traces can be formed in a three dimensional array.

A second trace can be attached to at least one of the first and second printed wiring boards and can attach at least a third printed wiring board to at least one of the first and second traces.

A support structure and a fixture can be formed, wherein the support structure can be connected to the first three dimensional trace and the fixture can be connected to the support structure.

The support structure can be removed from the first three dimensional trace.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of assembling a circuit card assembly, the method comprising:
   forming a first three dimensional trace by layer-by-layer additive manufacturing, wherein the first three dimensional trace comprises a first end and a second end;
   forming a support structure and a fixture, wherein the support structure is connected to the first three dimensional trace and the fixture is connected to the support structure;
   attaching the first three dimensional trace to a first printed wiring board with a first receiving feature by inserting the first end of the first three dimensional trace into the first receiving feature; and
   attaching a second printed wiring board to the first three dimensional trace by receiving the second end of the first three dimensional trace in a second receiving feature of the second printed wiring board.

2. The method of claim 1, wherein forming the first three dimensional trace comprises forming a plurality of traces in a three dimensional array.

3. The method of claim 2, further comprising attaching a second trace to at least one of the first and second printed wiring boards and attaching at least a third printed wiring board to at least one of the first and second traces.

4. The method of claim 1, further comprising removing the support structure from the first three dimensional trace.

5. The method of claim 1, further comprising integrally forming the first three dimensional trace, the support structure, and the fixture together as a single piece of material.

6. The method of claim 1, further comprising supporting the first three dimensional trace with the support structure during the additive manufacturing of the first three dimensional trace.

7. The method of claim 1, further comprising removing the support structure and the fixture from the first three dimensional trace after the first printed wiring board is attached to the first three dimensional trace.

8. The method of claim 7, wherein removing the support structure and the fixture from the first three dimensional trace comprises applying at least one of a frictional force, a torsional force, a tensile force, a compressive force, a vibration force, and a thermodynamic force to at least one of the support structure and the fixture.

9. A circuit card assembly formed by the method of claim 1, wherein the circuit card assembly comprises:
   the first printed wiring board with the first receiving feature;
   the second printed wiring board with the second receiving feature; and
   the first three dimensional trace, wherein the first end of the first three dimensional trace engages with the first receiving feature of the first printed wiring board, and wherein the second end of the first three dimensional trace engages with the second printed wiring board.

10. The method of claim 1, wherein the circuit card assembly comprises a plurality of traces in a three dimensional array.

11. The method of claim 1, wherein the first receiving feature of the first printed wiring board comprises a solder cup, a socket, a surface mount, or a thru-hole.

12. The method of claim 1, wherein the second end of the first three dimensional trace comprises a pin or a socket.

13. The method of claim 1, wherein the circuit card assembly further comprises a structural support, a stop, a chamfer, a heat sink, a test point lead, an electromagnetic shield, a locating feature, or a resilient element with a spring constant.

14. The method of claim 13, further comprising tuning at least one of a material or a configuration of the structural support to match a frequency level of an airborne munition into which the circuit card assembly is configured to be installed.

15. The method of claim 1, wherein the first three dimensional trace comprises a non-conductive material.

16. The method of claim 1, wherein the second printed wiring board is disposed non-parallel to the first printed wiring board.

17. The method of claim 1, further comprising providing spacing between the first and second traces such that at least one of electro-dynamic interference, thermodynamic interference, and arcing is prevented between the first and second traces.

18. The method of claim 1, further comprising electrically insulating the circuit card assembly by inserting a potting material between any two or more of the first three dimensional trace, the second trace, the first printed wiring board, and the second printed wiring board.

19. The method of claim 1, further comprising tuning a spring constant of at least one of the first or second traces by adjusting at least one of a quantity, a length, and a size of the at least one of the first or second traces.

20. A method of assembling a circuit card assembly, the method comprising:
- forming a first three dimensional trace by layer-by-layer additive manufacturing, wherein the first three dimensional trace comprises a first end and a second end, wherein forming the first three dimensional trace comprises forming a plurality of traces in a three dimensional array;
- attaching the first three dimensional trace to a first printed wiring board with a first receiving feature by inserting the first end of the first three dimensional trace into the first receiving feature;
- attaching a second printed wiring board to the first three dimensional trace by receiving the second end of the first three dimensional trace in a second receiving feature of the second printed wiring board;
- attaching a second trace to at least one of the first and second printed wiring boards; and
- attaching at least a third printed wiring board to at least one of the first and second traces.

\* \* \* \* \*